(12) United States Patent
Lin et al.

(10) Patent No.: US 10,950,716 B2
(45) Date of Patent: Mar. 16, 2021

(54) METAL OXIDE TFT, MANUFACTURING METHOD THEREOF, AND DISPLAY DEVICE

(71) Applicant: SHENZHEN CHINA STAR OPTOELECTRONICS TECHNOLOGY CO., LTD., Guangdong (CN)

(72) Inventors: Qinzun Lin, Guangdong (CN); Guihua Huang, Guangdong (CN)

(73) Assignee: SHENZHEN CHINA STAR OPTOELECTRONICS TECHNOLOGY CO., LTD., Guangdong (CN)

(*) Notice: Subject to any disclaimer, the term of this patent is extended or adjusted under 35 U.S.C. 154(b) by 375 days.

(21) Appl. No.: 16/076,276

(22) PCT Filed: Jul. 10, 2018

(86) PCT No.: PCT/CN2018/095086
§ 371 (c)(1),
(2) Date: Aug. 7, 2018

(87) PCT Pub. No.: WO2019/223076
PCT Pub. Date: Nov. 28, 2019

(65) Prior Publication Data
US 2020/0357901 A1    Nov. 12, 2020

(30) Foreign Application Priority Data

May 21, 2018  (CN) .......................... 201810491260.1

(51) Int. Cl.
*H01L 33/08*    (2010.01)
*H01L 29/417*   (2006.01)
(Continued)

(52) U.S. Cl.
CPC .... *H01L 29/66969* (2013.01); *H01L 27/1225* (2013.01); *H01L 27/1262* (2013.01); *H01L 27/1288* (2013.01); *H01L 29/401* (2013.01)

(58) Field of Classification Search
CPC .............. H01L 27/124; H01L 27/1259; H01L 29/66969; G03F 7/70733
See application file for complete search history.

(56) References Cited

U.S. PATENT DOCUMENTS

| 2005/0142680 A1 | 6/2005 | Ha et al. |
| 2010/0012946 A1* | 1/2010 | Zhi ........................ G02F 1/1368 257/72 |

(Continued)

FOREIGN PATENT DOCUMENTS

| CN | 102254861 A | 11/2011 |
| CN | 104538348 A | 4/2015 |
| CN | 107689345 A | 2/2018 |

*Primary Examiner* — Brian Turner
(74) *Attorney, Agent, or Firm* — Leong C. Lei

(57) ABSTRACT

The present invention teaches a method of manufacturing a metal oxide thin film transistor (TFT) that includes the following steps: forming a shielding layer, a metal oxide semiconductor layer, a gate electrode, and a first photoresist pattern layer stacked on a substrate; forming a second photoresist layer on the metal oxide semiconductor layer and the first photoresist pattern layer; conducting ashing process to the second photoresist layer and the first photoresist pattern layer, and lifting the second photoresist layer and first photoresist pattern layer after they are ashing-processed; forming a first insulation layer on the metal oxide semiconductor layer and the gate electrode; and forming independent source electrode and drain electrode on the first insulation layer. The present invention deposits the second photoresist layer on the first photoresist pattern layer hardened by the conductorization process, so that they may be easily lifted after the ashing process.

6 Claims, 5 Drawing Sheets

(51) Int. Cl.
*H01L 29/786* (2006.01)
*H01L 21/44* (2006.01)
*H01L 27/12* (2006.01)
*H01L 29/66* (2006.01)
*H01L 29/40* (2006.01)

(56) References Cited

U.S. PATENT DOCUMENTS

| | | | |
|---|---|---|---|
| 2015/0001542 A1* | 1/2015 | Jang | H01L 27/124 |
| | | | 257/67 |
| 2015/0294908 A1* | 10/2015 | Bayraktaroglu | H01L 29/7869 |
| | | | 438/677 |
| 2017/0084707 A1* | 3/2017 | Yang | H01L 21/44 |
| 2017/0104089 A1* | 4/2017 | Koezuka | H01L 29/7782 |
| 2017/0160841 A1* | 6/2017 | Lou | G06F 3/0412 |

* cited by examiner

METAL OXIDE TFT, MANUFACTURING METHOD THEREOF, AND DISPLAY DEVICE

RELATED APPLICATIONS

The present application is a National Phase of International Application Number PCT/CN2018/095086, filed Jul. 10, 2018, and claims the priority of China Application No. 201810491260.1, filed May 21, 2018.

FIELD OF THE INVENTION

The present invention is generally related to the manufacturing of thin film transistor (TFT), and more particularly to a metal oxide TFT, its manufacturing method, and a display device.

BACKGROUND OF THE INVENTION

Existing display devices, such as liquid crystal display (LCD) or organic lighting emitting diode (OLED) display devices, often adopt TFTs as control switches. These TFTs are often amorphous silicon (a-Si) TFTs.

On the other hand, metal oxide TFTs have higher electronic mobility rate than that of the a-Si TFTs, and metal oxide TFTs may be applied in transparent displays. Therefore, metal oxide TFTs are a more promising technique. However, in the conductorization of metal oxide during the manufacturing of top-gate metal oxide TFT, top photoresist may be hardened, making its lifting in subsequent process more difficult.

SUMMARY OF THE INVENTION

To resolve the above technical issue, an objective of the present invention is to provide a metal oxide TFT, a related manufacturing method, and a display device, where the photoresist is easy to lift.

The present invention teaches a method of manufacturing a metal oxide thin film transistor (TFT) that includes the following steps: forming a shielding layer, a metal oxide semiconductor layer, a gate electrode, and a first photoresist pattern layer stacked on a substrate; forming a second photoresist layer on the metal oxide semiconductor layer and the first photoresist pattern layer; conducting aching process to the second photoresist layer and the first photoresist pattern layer, and lifting the second photoresist layer and first photoresist pattern layer after they are ashing-processed; forming a first insulation layer on the metal oxide semiconductor layer and the gate electrode; and forming independent source electrode and drain electrode on the first insulation layer that penetrate the first insulation layer and contact the metal oxide semiconductor layer.

Furthermore, the step of forming the shielding layer, the metal oxide semiconductor layer, the gate electrode, and the first photoresist pattern layer stacked on the substrate comprises: forming the shielding layer on the substrate; forming a second insulation layer on the substrate and the shielding layer; and forming the metal oxide semiconductor layer, a gate insulation layer, the gate electrode, and the first photoresist pattern layer stacked on the second insulation layer.

Furthermore, the step of forming the metal oxide semiconductor layer, the gate insulation layer, the gate electrode, and the first photoresist pattern layer stacked on the second insulation layer comprises: forming a metal oxide layer on the second insulation layer; forming a third insulation layer on the second insulation layer and the metal oxide layer; forming a first metallic layer and a first photoresist layer stacked on the third insulation layer; forming the gate insulation layer, the gate electrode, and the first photoresist pattern layer by patterning the first photoresist layer, the first metallic layer, and the third insulation layer; and obtaining the metal oxide semiconductor layer by conducting conductorization to the metal oxide layer.

Furthermore, the gate insulation layer includes a first insulation section adjoining a lateral side of the metal oxide layer, a second insulation section adjoining another lateral side of the metal oxide layer, and a third insulation section disposed on the metal oxide layer. The gate electrode is disposed on the third insulation section. The first photoresist pattern layer includes a first photoresist section disposed on the first insulation section, a second photoresist section disposed on the second insulation section, and a third photoresist section disposed on the gate electrode.

Furthermore, the third insulation section, the gate electrode, and the third photoresist section have projection onto the metal oxide layer entirely falling within the metal oxide layer.

Furthermore, the step of forming the shielding layer on the substrate comprises: forming a second metallic layer on the substrate; and patterning the second metallic layer so as to form the shielding layer.

Furthermore, the second photoresist layer is disposed on the first photoresist section, the second photoresist section, the third photoresist section, the metal oxide semiconductor layer, and the second insulation layer.

Furthermore, the step of forming independent source electrode and drain electrode on the first insulation layer that penetrate the first insulation layer and contact the metal oxide semiconductor layer comprises: forming a first via and a second via in the first insulation layer exposing the metal oxide semiconductor layer; forming a third metallic layer on the first insulation layer that fills the first and second vias and contacts the metal oxide semiconductor layer; and patterning the third metallic layer so as to form the independent source and drain electrodes.

The present invention also teaches a metal oxide thin film transistor (TFT) manufactured by the above described method.

The present invention also teaches a display device including a metal oxide TFT manufactured by the above described method.

Furthermore, the display device may be liquid crystal display (LCD) device or an organic light emitting diode (OLED) display device.

The advantage of the present invention is as follows. The present invention deposits the second photoresist layer on the first photoresist pattern layer that is hardened by the conductorization process, so that the second photoresist layer and the first photoresist pattern layer jointly form a level photoresist layer that may be easily lifted after the ashing process.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

Figure 1:
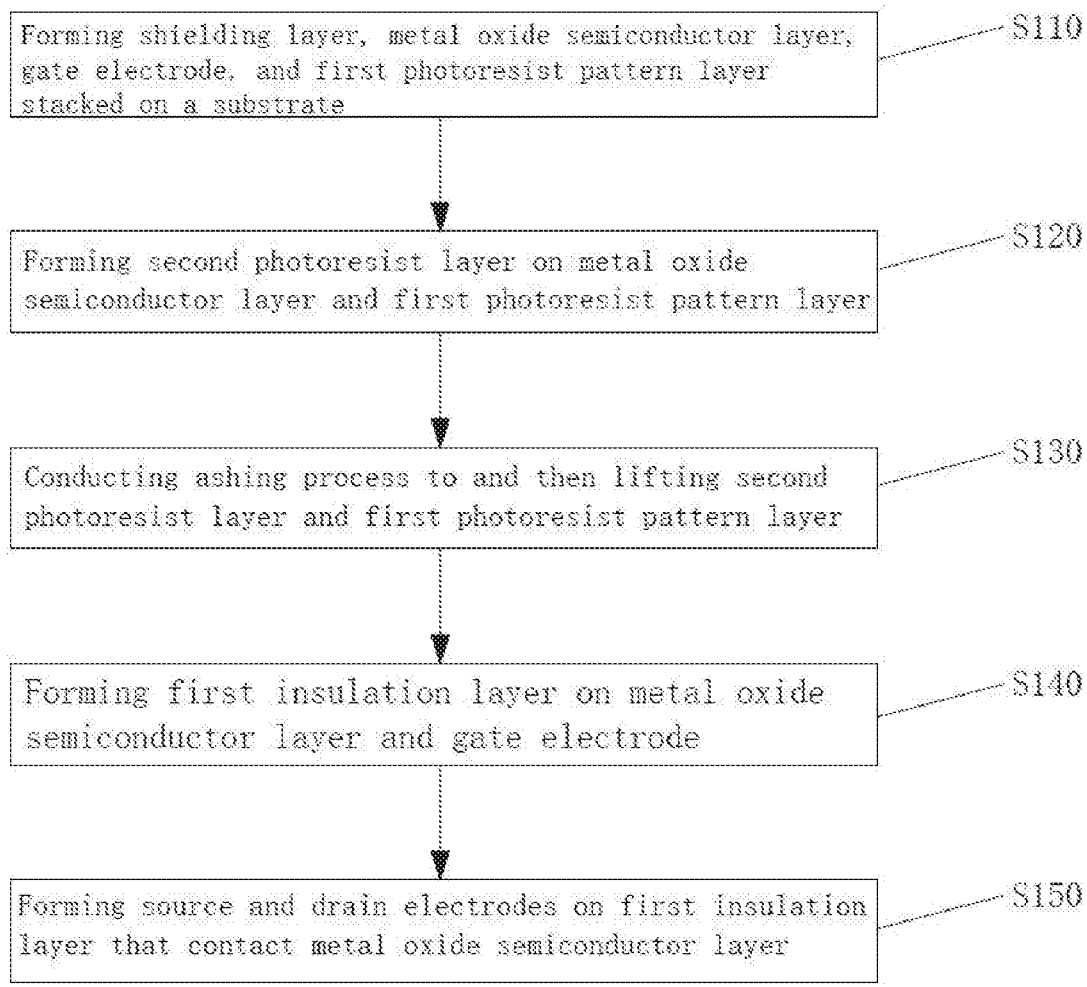
FIG. 1 is a flow diagram showing a method of manufacturing a metal oxide TFT according to an embodiment of the present invention.

The following descriptions for the respective embodiments are specific embodiments capable of being implemented for illustrations of the present invention with referring to appended figures.

For the sake of clear illustration, the thickness of some layers and regions in the drawings is exaggerated. Same numerals are applied to identical components through the specification and drawings.

It should be understood that a component such as a layer, film, section, etc., is said to be disposed "on" another component, the former may directly contact the latter, or there may be some intermediate component in between. Selectively, when a component is said to be "immediately on" another components, there is no intermediate component.

Figure 2A:
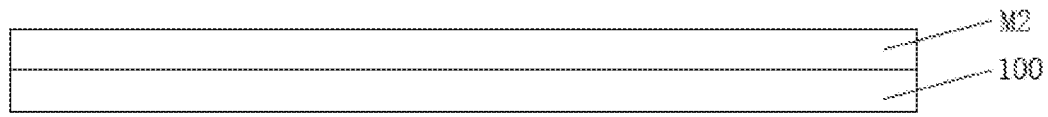
FIGS. 2A to 2N respectively show the manufacturing of a metal oxide TFT after the steps of FIG. 1.

FIG. 1 is a flow diagram showing a method of manufacturing a metal oxide TFT according to an embodiment of the present invention. FIGS. 2A to 2N respectively show the manufacturing of a metal oxide TFT after the steps of FIG. 1.

Step 1, as shown in FIG. 2A, forms a second metallic layer M2 on a substrate 100.

The substrate 100 may be an insulating and transparent glass or resin substrate. The second metallic layer M2 may be a structure of stacked Mo, Al, Mo layers, or of stacked Ti, Al, Ti layers. The second metallic layer M2 may also be a single layer of Mo, or a single layer of Al.

Figure 2B:
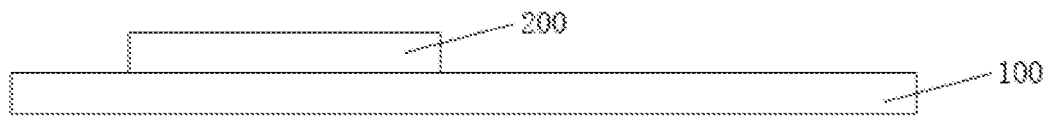

Step 2, as shown in FIG. 2B, patterns the second metallic layer M2 so as to form a shielding layer 200.

As described, steps 1 and 2 complete the formation of the shielding layer 200 on the substrate 100.

Figure 2C:
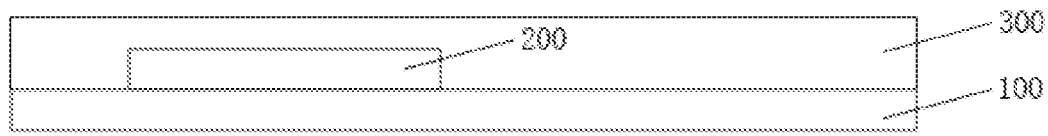

Step 3, as shown in FIG. 2C, forms a second insulation layer 300 on the substrate 100 and the shielding layer 200.

The second insulation layer 300 may be a structure of stacked SiNx, SiOx layers, a single layer of SiNx, or a single layer of SiOx.

Figure 2D:
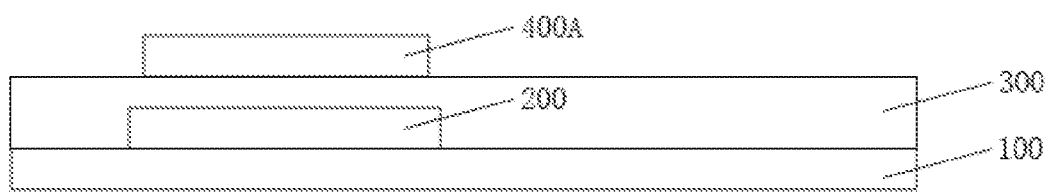

Step 4: as shown in FIG. 2D, forms a patterned metal oxide layer 400A on the second insulation layer 300.

The metal oxide layer 400A may be made of indium gallium zinc oxide (IGZO), indium zinc oxide (IZO), or indium gallium zinc tin oxide (IGZTO).

Figure 2E:
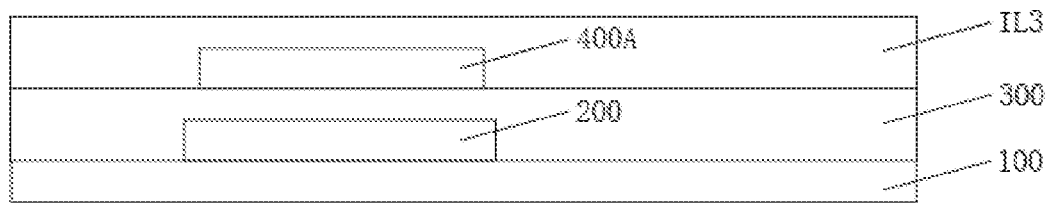

Step 5, as shown in FIG. 2E, forms a third insulation layer ID on the second insulation layer 300 and the metal oxide layer 400A.

The third insulation layer IL3 may be a structure of stacked SiNx, SiOx layers, a single layer of SiNx, or a single layer of SiOx.

Figure 2F:
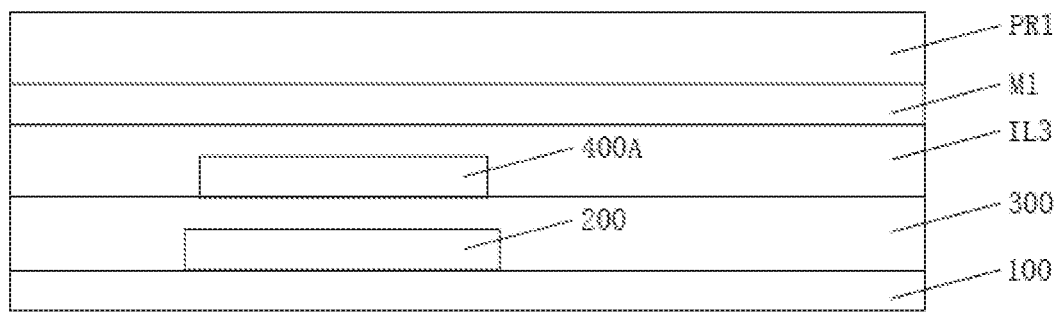

Step 6, as shown in FIG. 2F, forms a first metallic layer M1 and a first photoresist layer PR1 sequentially stacked on the third insulation layer ID.

The first metallic layer M1 may be a structure of stacked Mo, Al, Mo layers, or of stacked Ti, Al, Ti layers. The first metallic layer M1 may also be a single layer of Mo, or a single layer of Al.

Figure 2G:
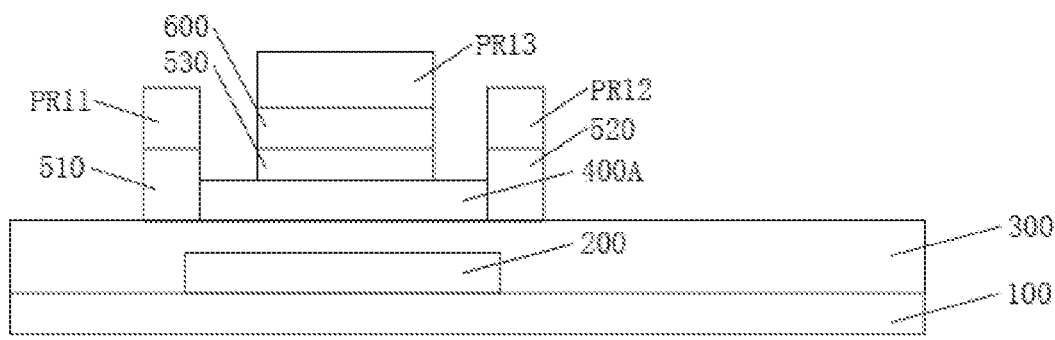

Step 7, as shown in FIG. 2G, forms a gate insulation layer, a gate electrode 600, and a photoresist pattern layer by patterning the first photoresist layer PR1, the first metallic layer M1, and the third insulation layer IL3.

The gate insulation layer includes a first insulation section 510 adjoining a lateral side of the metal oxide layer 400A, a second insulation section 520 adjoining another lateral side of the metal oxide layer 400A, and a third insulation section 530 disposed on the metal oxide layer 400A. The gate electrode 600 is disposed on the third insulation section 530. The first photoresist pattern layer includes a first photoresist section PR11 disposed on the first insulation section 510, a second photoresist section PR12 disposed on the second insulation section 520, and a third photoresist section PR13 disposed on the gate electrode 600.

Figure 2H:
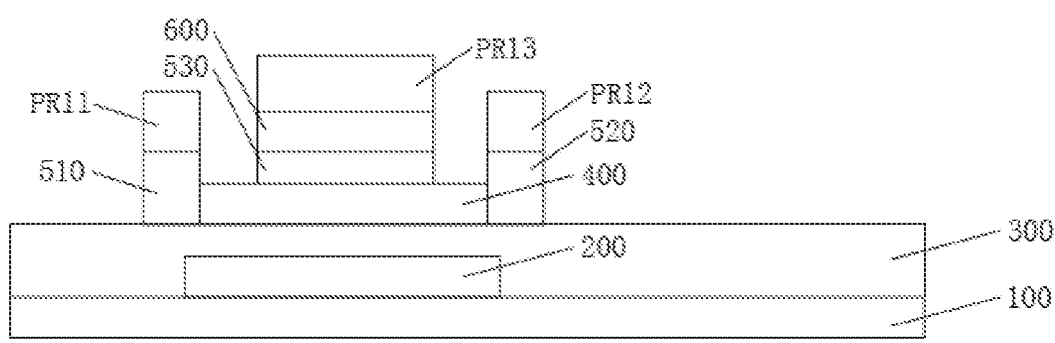

Step 8, as shown in FIG. 2H, obtains a metal oxide semiconductor layer 400 by conducting conductorization to the metal oxide layer 400A. As mentioned in the Background, when the metal oxide layer 400A is conductorized, the first photoresist pattern layer may be hardened, causing difficulty in lifting the first photoresist pattern layer.

As such, steps 4 to 8 jointly complete the formation of the metal oxide semiconductor layer 400, the gate insulation layer, the gate electrode 600, and the first photoresist pattern layer, stacked on the second insulation layer 300. In addition, steps 1 to 8 jointly complete the step S110 of FIG. 1.

Furthermore, the third insulation section 530, the gate electrode 600, and the third photoresist section PR13 have projection onto the metal oxide semiconductor layer 400 entirely falling within the metal oxide semiconductor layer 400. In this way, a portion of the metal oxide semiconductor layer 400 is exposed. Furthermore, the third insulation section 530, the gate electrode 600, and the third photoresist section PR13 have projection within a middle section of the metal oxide semiconductor layer 400.

Figure 2I:
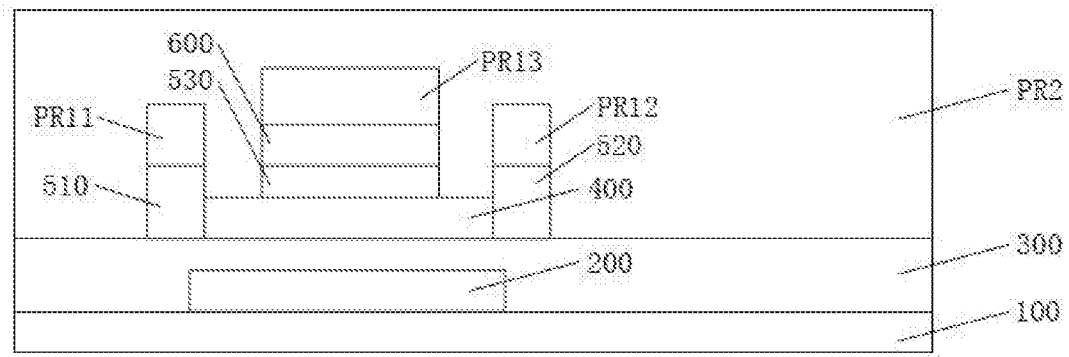

Step 9, as shown in FIG. 2I, forms a second photoresist layer PR2 on the metal oxide semiconductor layer 400 and the first photoresist pattern layer.

Furthermore, the second photoresist layer PR2 is also disposed on the second insulation layer 300. As such, step 9 completes the step S120 of FIG. 1.

Figure 2J:
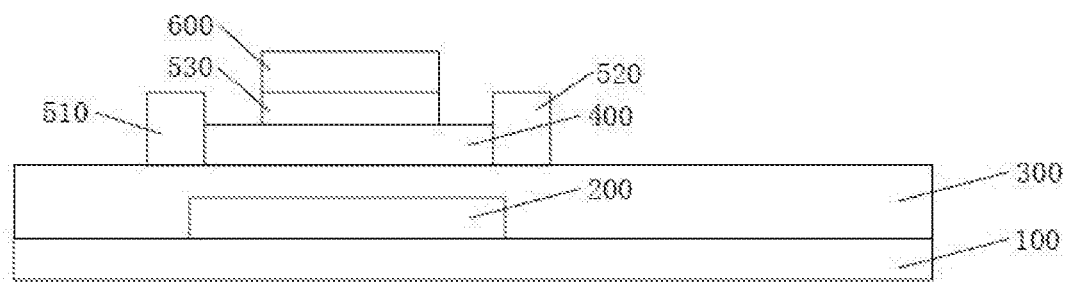

Step 10, as shown in FIG. 2J, conducts ashing process to the second photoresist layer PR2 and the first photoresist pattern layer, and lifts the ashing-processed second photoresist layer PR2 and first photoresist pattern layer.

By depositing the second photoresist layer PR2, the second photoresist layer PR2 and the first photoresist pattern layer jointly form a level, flat, and integral photoresist layer that may be easily lifted after the ashing process. As such, step 10 completes the step S130 of FIG. 1.

Figure 2K:
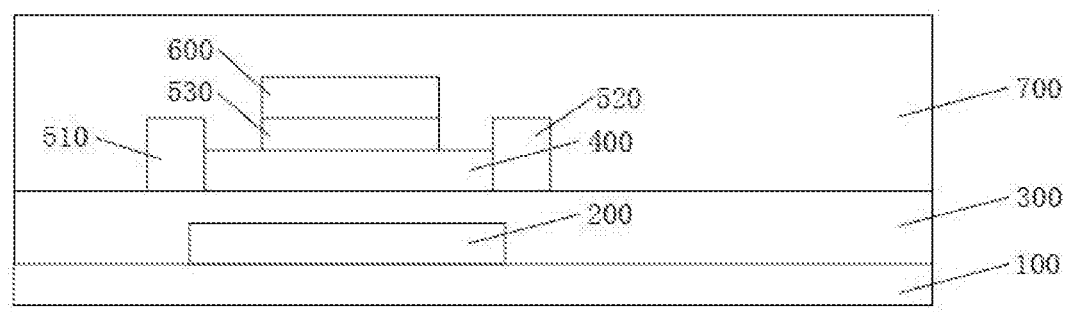

Step 11, as shown in FIG. 2K, forms a first insulation layer 700 on the metal oxide semiconductor layer 400, the gate electrode 600, and the second insulation layer 300.

The first insulation layer 700 may be a structure of stacked SiNx, SiOx layers, a single layer of SiNx, or a single layer of SiOx. As such, step 11 completes the step S140 of FIG. 1.

Figure 2L:
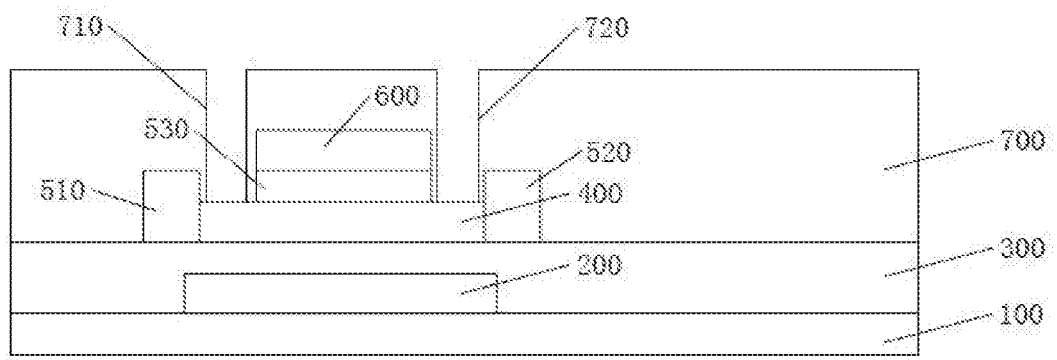

Step 12, as shown in FIG. 2L, forms a first via 710 and a second via 720 in the first insulation layer 700 exposing the metal oxide semiconductor layer 400.

Figure 2M:
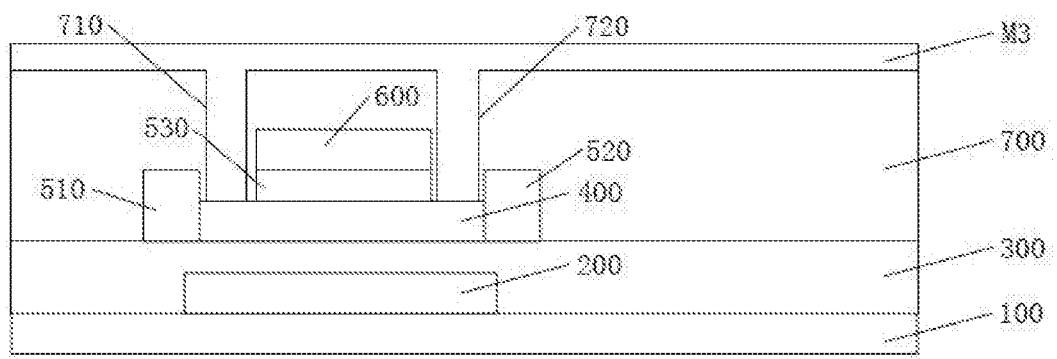
Figure 2N:
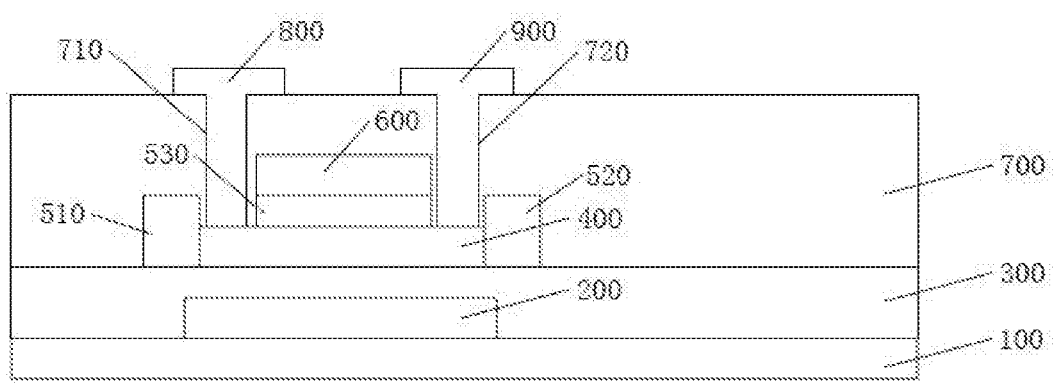

Step 13, as shown in FIG. 2M, forms a third metallic layer M3 on the first insulation layer 700 that fills the first and second vias 710 and 720, and contacts the metal oxide semiconductor layer 400.

Step 14, as shown in FIG. 2N, forms independent source electrode 800 and drain electrode 900 by patterning the third metallic layer M3.

As such, steps 12 to 14 complete the step S150 of FIG. 1.

The present invention also teaches a metal oxide thin film transistor (TFT) manufactured by the above described method.

The present invention also teaches a display device including a metal oxide TFT manufactured by the above described method. The display device may be liquid crystal display (LCD) device or an organic light emitting diode (OLED) display device.

As described above, the present invention deposits the second photoresist layer on the first photoresist pattern layer that is hardened by the conductorization process, so that the second photoresist layer and the first photoresist pattern layer jointly form a level, flat, and integral photoresist layer that may be easily lifted after the ashing process.

Above are embodiments of the present invention, which does not limit the scope of the present invention. Any equivalent amendments within the spirit and principles of the embodiment described above should be covered by the protected scope of the invention.

What is claimed is:

1. A manufacturing method for a metal oxide thin film transistor (TFT), comprising
    forming a shielding layer on a substrate;
    forming a second insulation layer on the substrate and the shielding layer;
    forming a metal oxide layer on the second insulation layer;
    forming a third insulation layer on the second insulation layer and the metal oxide layer;
    forming a first metallic layer and a first photoresist layer sequentially stacked on the third insulation layer;
    forming a gate insulation layer, a gate electrode, and a first photoresist pattern layer by patterning the first photoresist layer, the first metallic layer, and the third insulation layer, where the gate insulation layer comprises a first insulation section adjoining a lateral side of the metal oxide layer, a second insulation section adjoining another lateral side of the metal oxide layer, and a third insulation section disposed on the metal oxide layer; the gate electrode is disposed on the third insulation section, and the first photoresist pattern layer comprises a first photoresist section disposed on the first insulation section, a second photoresist section disposed on the second insulation section, and a third photoresist section disposed on the gate electrode;
    obtaining a metal oxide semiconductor layer by conducting conductorization to the metal oxide layer;
    forming a second photoresist layer on the metal oxide semiconductor layer and the first photoresist pattern layer, where the second photoresist layer is disposed on the first photoresist section, the second photoresist section, the third photoresist section, the metal oxide semiconductor layer, and the second insulation layer, and the second photoresist layer and the first photoresist pattern layer jointly form an integral photoresist layer;
    conducting ashing process to the integral photoresist layer, and lifting the ashing-processed integral photoresist layer;
    forming a first insulation layer on the metal oxide semiconductor layer and the gate electrode; and
    forming independent source electrode and drain electrode on the first insulation layer that penetrate the first insulation layer and contact the metal oxide semiconductor layer.

2. The manufacturing method according to claim 1, wherein the third insulation section, the gate electrode, and the third photoresist section have projection onto the metal oxide layer entirely falling within the metal oxide layer.

3. The manufacturing method according to claim 1, wherein the step of forming the shielding layer on the substrate comprises:
    forming a second metallic layer on the substrate; and
    patterning the second metallic layer so as to form the shielding layer.

4. The manufacturing method according to claim 1, wherein the step of forming independent source electrode and drain electrode on the first insulation layer that penetrate the first insulation layer and contact the metal oxide semiconductor layer comprises:
    forming a first via and a second via in the first insulation layer exposing the metal oxide semiconductor layer;
    forming a third metallic layer on the first insulation layer that fills the first and second vias and contacts the metal oxide semiconductor layer; and
    patterning the third metallic layer so as to form the independent source and drain electrodes.

5. A metal oxide TFT manufactured by the method as claimed in claim 1.

6. A display device, comprising a metal oxide TFT as claimed in claim 5.

* * * * *